(12) United States Patent
Kocon et al.

(10) Patent No.: US 7,005,353 B2
(45) Date of Patent: Feb. 28, 2006

(54) METHOD FOR IMPROVED MOS GATING TO REDUCE MILLER CAPACITANCE AND SWITCHING LOSSES

(75) Inventors: Christopher B. Kocon, Plains, PA (US); Alan Elbanhawy, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/052,258

(22) Filed: Feb. 7, 2005

(65) Prior Publication Data

US 2005/0145934 A1 Jul. 7, 2005

Related U.S. Application Data

(62) Division of application No. 10/640,742, filed on Aug. 14, 2003, now Pat. No. 6,870,220.

(60) Provisional application No. 60/405,369, filed on Aug. 23, 2002.

(51) Int. Cl.
*H01L 21/336* (2006.01)

(52) U.S. Cl. .................................. 438/270; 438/589
(58) Field of Classification Search .................. None
See application file for complete search history.

(56) References Cited

U.S. PATENT DOCUMENTS

| 4,735,914 A | * | 4/1988 | Hendrickson et al. ...... 438/276 |
| 4,941,026 A | | 7/1990 | Temple |
| 6,285,060 B1 | * | 9/2001 | Korec et al. ................ 438/270 |

* cited by examiner

*Primary Examiner*—Chandra Chaudhari
(74) *Attorney, Agent, or Firm*—Thomas R. Fitzgerald, Esq.

(57) ABSTRACT

A method for reducing miller capacitance and switching losses in an integrated circuit includes providing a switching gate electrode having respective portions that are coplanar with the source and well regions of the integrated circuit. The switching gate electrode is configured for switching the integrated circuit on and off in response to a relatively small change in applied voltage. A shielding gate electrode is formed with respective portions coplanar with the switching electrode and the well region. The shielding electrode is configured for charging the gate-to-drain overlap region of the integrated circuit.

22 Claims, 8 Drawing Sheets

NET DOPING PROFILE

METHOD FOR IMPROVED MOS GATING TO REDUCE MILLER CAPACITANCE AND SWITCHING LOSSES

CROSS-REFERENCE TO RELATED APPLICATIONS

This application is a divisional of U.S. patent application Ser. No. 10/640,742, which was filed 14 Aug. 2003 now U.S. Pat. No. 6,870,220 and entitled METHOD AND APPARATUS FOR IMPROVED MOS GATING TO REDUCE MILLER CAPACITANCE AND SWITCHING LOSSES, the disclosure of which is incorporated herein by reference, and which, in turn, claims the benefit of U.S. Provisional Patent Application Ser. No. Ser. 60/405,369 filed Aug. 23, 2002.

FIELD OF THE INVENTION

The present invention relates to semiconductors, and more particularly to metal-oxide semiconductor field effect transistors (MOSFETs).

DESCRIPTION OF THE RELATED ART

MOSFETs are used extensively in switching applications, such as, for example, switching power supplies, practically to the exclusion of other types of transistors. MOSFETs are suited to such switching applications due to their relatively high switching speed and low power requirements. However, the dynamic losses in MOSFETs represent a large percentage of the total losses in DC-to-DC converters. The dynamic losses are directly proportional to the device rise and fall times which are, in turn, proportional to the gate-to-drain capacitance, i.e., the Miller capacitance, of the device ($C_{GD}$ or $Q_{GD}$).

The Miller capacitance, as shown in FIG. 3, also results in a "flat" region in the gate curve of conventional MOSFETs. This flat region, referred to as the Miller region, is representative of the device transitioning from a blocking state to a conducting state or from a conducting state to a blocking state. It is in the Miller region that most of the switching losses occur since the device current and voltage are high. Reducing the Miller capacitance will reduce the time the device requires to undergo the transition from conduction to blocking or vice versa, and thereby reduce switching losses.

The Miller capacitance is reduced by reducing the area over which the gate and drain regions overlap. In prior art devices, this overlap area includes the bottom of the gate trench. Thus, many prior art attempts to reduce the Miller capacitance have focused on narrowing the trench width to thereby reduce the width of the trench bottom and thus the overlap area. However, the ability to further reduce trench width is limited by the ability to etch narrow trenches, and the corresponding need to be able to fill the narrow trenches with gate electrode material.

Therefore, what is needed in the art is a MOSFET having a reduced miller capacitance, and therefore reduced switching losses.

Moreover, what is needed in the art is a MOSFET having a reduced Miller capacitance for a given trench width.

SUMMARY OF THE INVENTION

The present invention provides a gate structure for a semiconductor device.

The invention comprises, in one form thereof, a method for reducing miller capacitance and switching losses in an integrated circuit includes providing a switching gate electrode having respective portions that are coplanar with the source and well regions of the integrated circuit. The switching gate electrode is configured for switching the integrated circuit on and off in response to a relatively small change in applied voltage. A shielding gate electrode is formed with respective portions coplanar with the switching electrode and the well region. The shielding electrode is configured for charging the gate-to-drain overlap region of the integrated circuit.

An advantage of the present invention is that for a given trench width, Miller capacitance of the semiconductor device is reduced relative to a prior art device.

A further advantage of the present invention is that the device switching times and switching losses are reduced.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
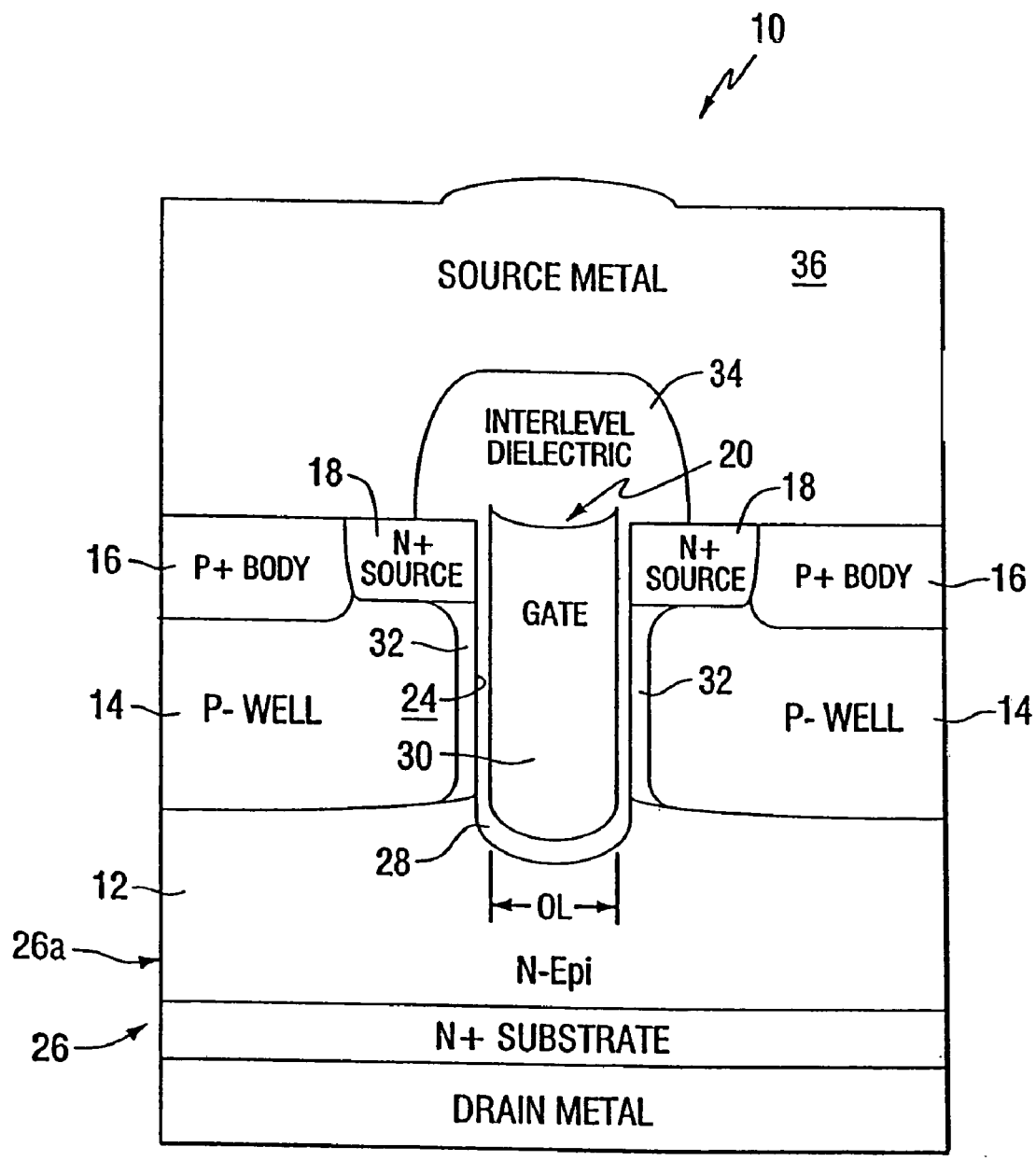
FIG. 1 is a cross-sectional schematic view of a prior art trench metal-oxide-semiconductor-gated (MOS-gated) structure.

Referring now to the drawings and particularly to FIG. 1, there is shown in cross-section a schematic view of a prior art trench-gated MOSFET device. MOSFET device 10 includes drain region 12, well region 14, body region 16, source region 18, gate region 20 and trench 24, all of which are formed on substrate 26.

More particularly, N+ type substrate 26 includes upper layer 26a within which is formed N− drain region 12. P-type well region 14 overlies drain region 12. At an upper surface (not referenced) of upper layer 26a and within a portion of well region 14 is defined a heavily doped P+ body region 16. Also formed at the upper surface of upper layer 26a and within a portion of well region 14, and proximate trench 24, is formed heavily doped N+ source region 18. The sidewalls and bottom (not referenced) of trench 24 are lined with dielectric material 28, such as, for example, oxide. Gate region 20 is formed of a conductive material 30, such as, for example, doped polysilicon, deposited in trench 24 and extending in a continuous manner from the bottom of trench 24 to proximate the upper surface of upper layer 26a. Thus, gate 20 is continuous relative to and/or through the channel region 32. An interlevel dielectric layer 34, such as, for example, borophosphosilicate glass (BPSG), overlies gate region 20 and a portion of source region 18. Source metal layer 36 overlies the upper surface of upper layer 26a and contacts body region 16 and source region 18.

Figure 2:
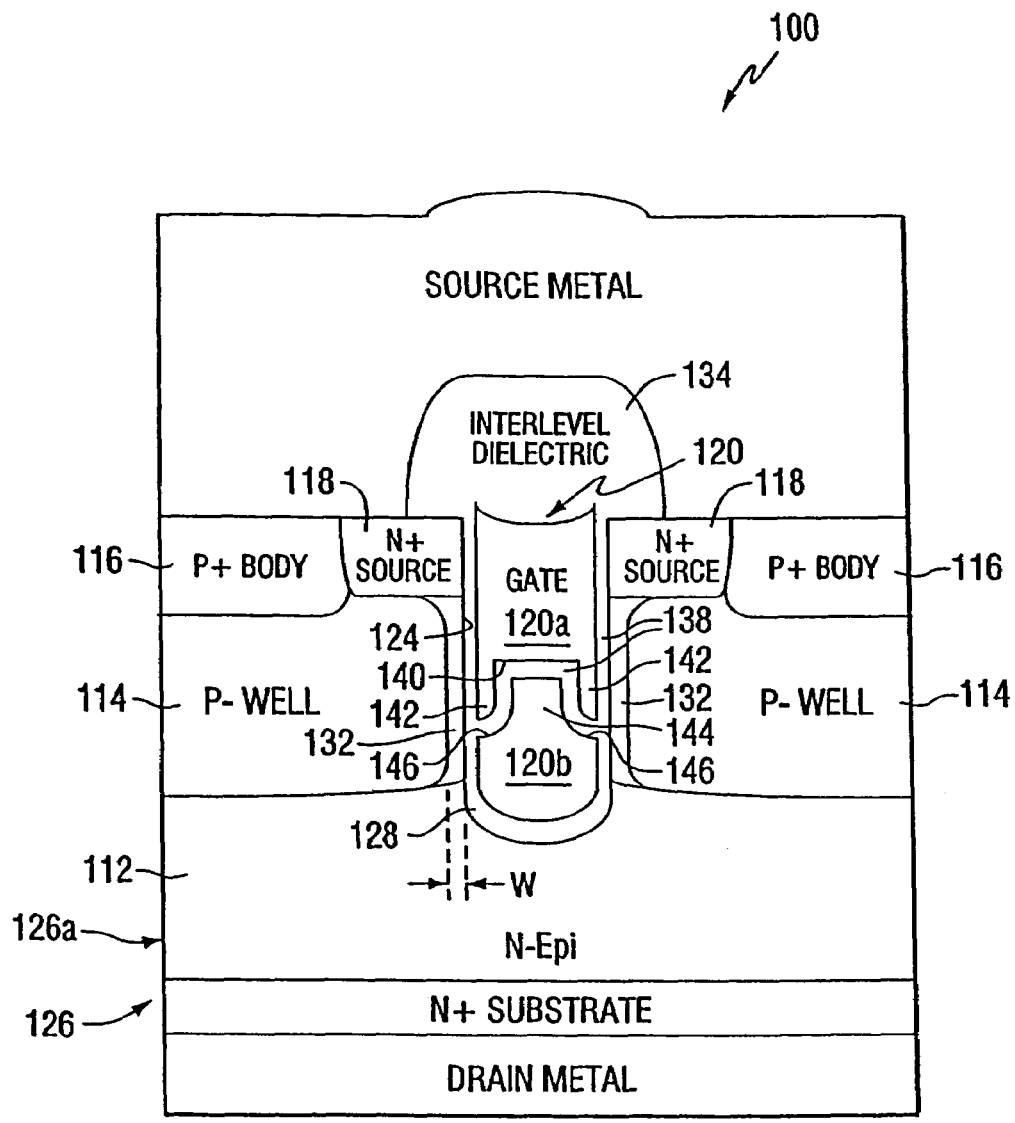
FIG. 2 is a cross-sectional schematic view of one embodiment of a MOS-gated structure of the present invention.

Referring now to FIG. 2, there is shown in cross-section a schematic view of one embodiment of a trench-gated MOSFET device of the current invention. MOSFET 100 includes many features and structures that are generally, if not substantially, similar to MOSFET 10. Like MOSFET 10, MOSFET 100 includes drain 112, well 114, body 116, source 118, gate structure 120 and trench 124, all of which are formed on substrate 126. However, unlike gate structure 20 of MOSFET 10, gate structure 120 of MOSFET 100 includes a dual overlapping gate structure that reduces Miller capacitance and improves switching speed, as will be explained more particularly hereinafter.

MOSFET 100 is formed on N+ type substrate 126 that includes an upper layer 126a within which is formed N− drain region 112. P-type well region 114 overlies drain region 112. At an upper surface (not referenced) of upper layer 126a and within a portion of well region 114 is defined a heavily doped P+ body region 116. Also formed at the upper surface of upper layer 126a and within a portion of well region 114, and proximate trench 124, is formed heavily doped N+ source region 118. The lower portion of the sidewalls proximate shielding electrode 120b and the bottom (not referenced) of trench 124 are lined with dielectric material 128, such as, for example, oxide.

Gate structure 120 of MOSFET 100, rather than being one continuous and uninterrupted unitary and monolithic electrode as in MOSFET 10, is divided into separate switching and shielding electrodes that overlap each other. More particularly, gate structure 120 includes gate electrode 120a and gate electrode 120b. An interlevel dielectric layer 134 is disposed over gate electrode 120a and partially over source regions 118. Each of electrodes 120a and 120b are formed of a conductive material, such as, for example, doped polysilicon, deposited in trench 124. The first or top electrode 120a, which is formed of a layer of conductive material, is disposed approximately even with or recessed below the upper surface of upper layer 126a. First/top electrode 120a, hereinafter sometimes referred to as the switching electrode 120a, extends from proximate the upper surface of upper layer 126a horizontally coplanar with source regions 118 a predetermined distance toward the bottom of trench 124 such that the lower portion of first/top electrode 120a is horizontally coplanar with well region 114.

Second, or bottom, electrode 120b, formed of a second layer of conductive material, extends from adjacent the bottom of trench 124. A (lower) portion of second electrode 120b, sometimes referred to hereinafter as shielding electrode 120b, is horizontally coplanar with the junction (not referenced) of drain 112 and well regions 118, and another (upper) portion of second/bottom electrode 120b is horizontally coplanar with source region 118 and with first electrode 120a. Thus, first and second electrodes 120a and 120b, respectively, overlap each other relative to the depth of trench 124. The upper portion of the sidewalls adjacent switching electrode 120a and the top of shielding electrode 120b are covered with dielectric material 138, such as, for example, oxide. Thus, dielectric material 138 is disposed between gate electrodes 120a and 120b.

As stated above, shielding electrode 120b and switching electrode 120a at least partially overlap each other along the depth of trench 124. More particularly, in the embodiment shown in FIG. 2 gate electrode 120a at the surface thereof that is proximate shielding electrode 120b defines a recess 140, which is disposed between and/or surrounded by sidewalls 142 and within which a top hat portion 144 of shielding electrode 120b is disposed. Sidewalls 142 of switching electrode 120a and top hat portion 144 of shielding electrode 120b at least partially overlap each other in an axial or depth direction relative to trench 124. Thus, the overlapping gate electrode structure is provided. Further, and as will be more fully described hereinafter, top hat portion 144 and ledges 146 of shielding electrode 120b are formed as a result of the etching of the portion of dielectric layer 128 that is adjacent to, above and somewhat below the upper surface (not referenced) of the layer of conductive material of which shielding electrode 120b is comprised.

Generally, gate or switching electrode 120a functions as the switching electrode and switches MOSFET 100 on and/or off, whereas gate or shielding electrode 120b functions to create at least part of channel 132. In order to place MOSFET 100 into the conduction mode, bottom/shielding electrode 120b must be appropriately biased and/or turned on. Bottom or shielding electrode 120b is either continuously biased into the on or conducting state, or can be biased only prior to a switching event in order to prepare the device by placing it into the conduction mode. With bottom/shielding electrode 120b turned on, the current flow through MOSFET 100 is controlled via gate/bottom electrode 120a.

As stated above in regard to prior art MOSFET 10, and as shown in FIG. 1, the overlap area OL between gate region 20 and drain region 12 includes the bottom of the gate trench 24. In contrast, gate switching electrode 120a does not overlap with drain region 112. The only region of overlap between gate switching electrode 120a and drain region 112 is the width W of channel region 132, which is typically a mere few hundred angstroms wide. Channel 132 is created by the biasing of shielding electrode 120b. Channel region 132 extends from drain region 112 through well region 114 alongside trench 124 and shielding electrode 120b. The effective gate-to-drain overlap in MOSFET 100 (i.e., the width of channel 132) is therefore substantially reduced relative to the gate-to-drain overlap in MOSFET 10 (i.e., the area of the bottom of trench 24, which is typically from approximately 0.3 to 1.0 microns. Thus, the Miller capacitance, which as stated above is generally proportional to the area of gate-to-drain overlap, of MOSFET 100 is substantially reduced relative to the Miller capacitance of MOSFET 10.

Figure 3:
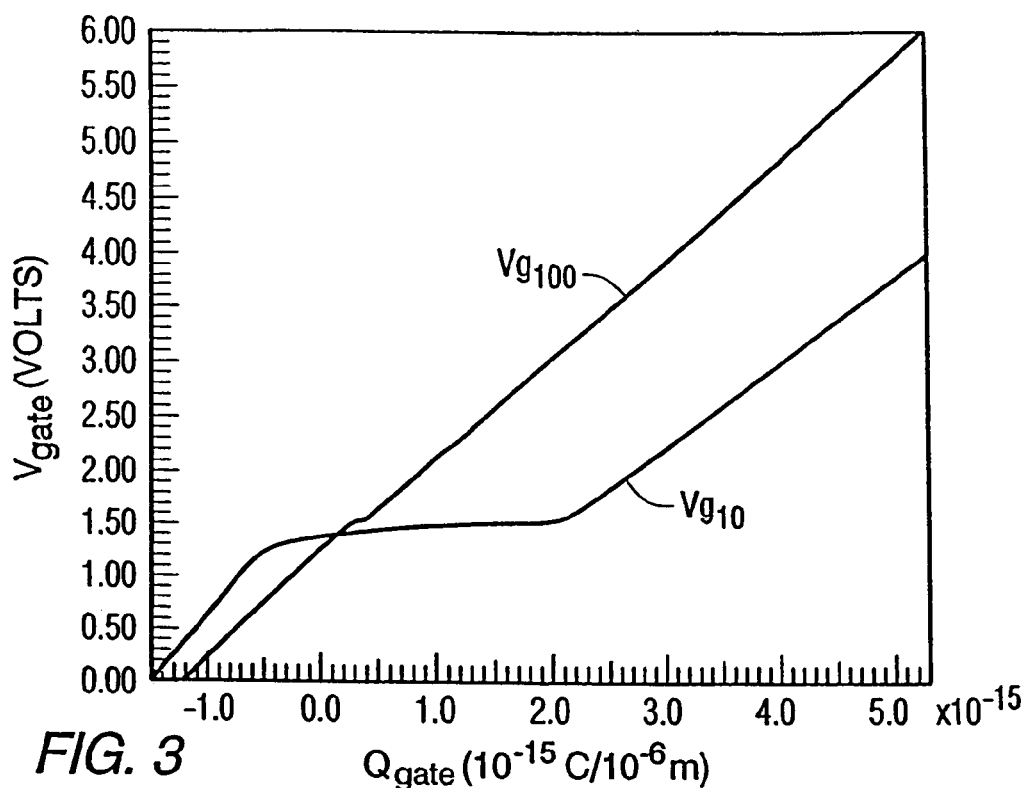
FIG. 3 is a plot of the gate switching waveforms for a conventional MOS-gated structure and the MOS-gated structure of FIG. 2.

The improvement (i.e., reduction) in Miller capacitance in MOSFET 100 relative to MOSFET 10 is graphically illustrated in FIG. 3, wherein the gate voltage waveforms for each device are plotted. The plot of the gate voltage waveform $Vg_{10}$ for MOSFET 10 has a generally flat region during which the gate charge $Q_{gate}$ increases from approximately 0.0 (zero) to approximately $2.00 \times 10^{-15}$ Coulombs per micrometer, whereas the gate voltage waveform $Vg_{100}$ for MOSFET 100 has virtually no corresponding generally flat area. Thus, it is shown that the Miller capacitance is substantially and dramatically reduced.

It should be particularly noted that in order to avoid any significant adverse affect to current flow in MOSFET 100, channel region 132 must be present and continuously open as the device transitions from the state wherein only shielding electrode 120b is biased to the state wherein main or switching gate 120b is also biased. The threshold voltage at which this transition occurs and the final driving voltage level are determined by the cross-over dopant concentration at the junction of the p-type well 114 and source 118 regions.

Figure 4:
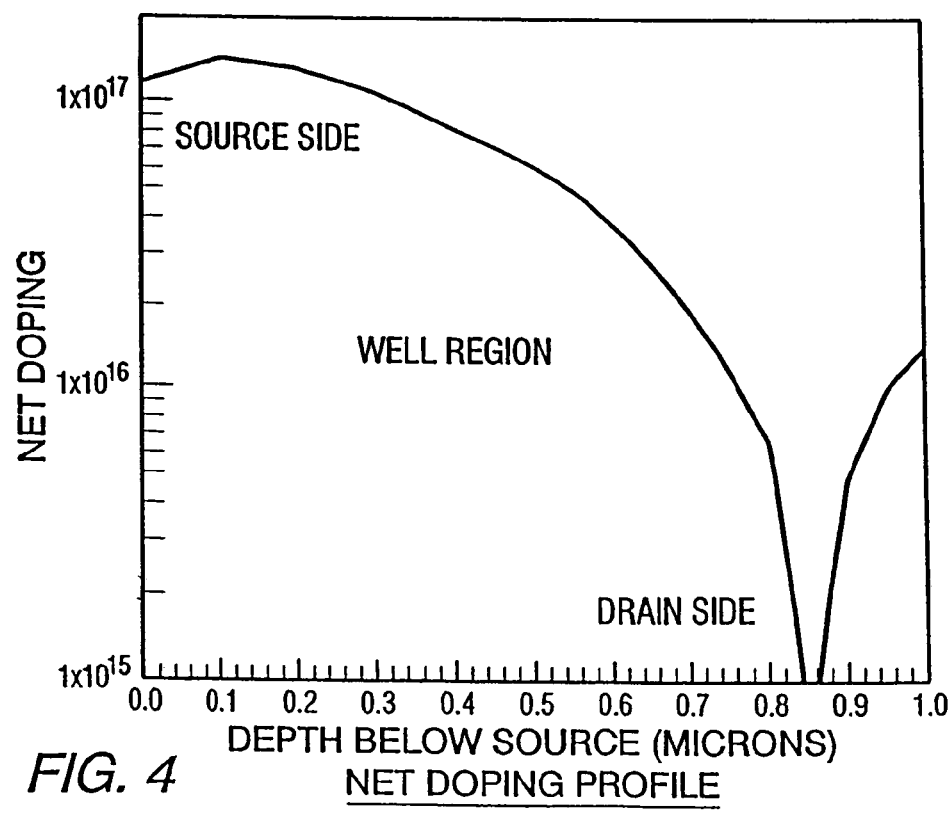
FIG. 4 is a plot of the typical net doping profile of the well of the MOS-gated structure of FIG. 2.

FIG. 4 plots the net doping profile at various depths below source region 118 within well region 114. The vertical axis of FIG. 4 corresponds to the interface of source region 118 with well region 114 (i.e., the "top" of well region 114) and is thus assigned the value of zero depth relative to well region 114. The shield electrode 120b is at a depth of approximately 0.6 to 0.8 microns below zero depth, and the drain side of the well region is at approximately 0.7 to 0.9 below zero depth. Thus, it is seen that the net doping within well region 114 is relatively high, such as, for example, approximately $1.0 \times 10^{17}$ proximate source region 118, and decreases therefrom toward a dopant concentration of from approximately $3.0 \times 10^{-16}$ to approximately $1.5 \times 10^{-16}$ in the portion of well region 114 that is proximate shielding electrode 120b and drain region 112. The interface of well region 114 and drain region 112 is indicated by the minimum value of dopant concentration that occurs at approximately 0.84 to 0.86 microns below zero depth.

Since the threshold and driving voltages are directly proportional to the oxide thickness and net doping level, the above-described doping profile enables use of a substantially thicker oxide layer, such as, for example, from approximately 100 to 1500 Angstroms, proximate drain region 112. The increased thickness of the oxide layer enables transition from shielding gate 120b to switching gate 120a, and for continuous current flow within channel region 132.

In operation, shielding electrode 120b is raised or biased to a potential that is sufficient to support a driving voltage level. In effect, the shielding electrode 120b charges the gate-to-drain overlap region, which as stated above is the region that generates the Miller capacitance in a conventional device. Once that gate-to-drain overlap region is charged by shielding electrode 120a, MOSFET 100 is easily switched on and/or off by a relatively small change in the voltage level applied to switching electrode 120a.

Figure 10:
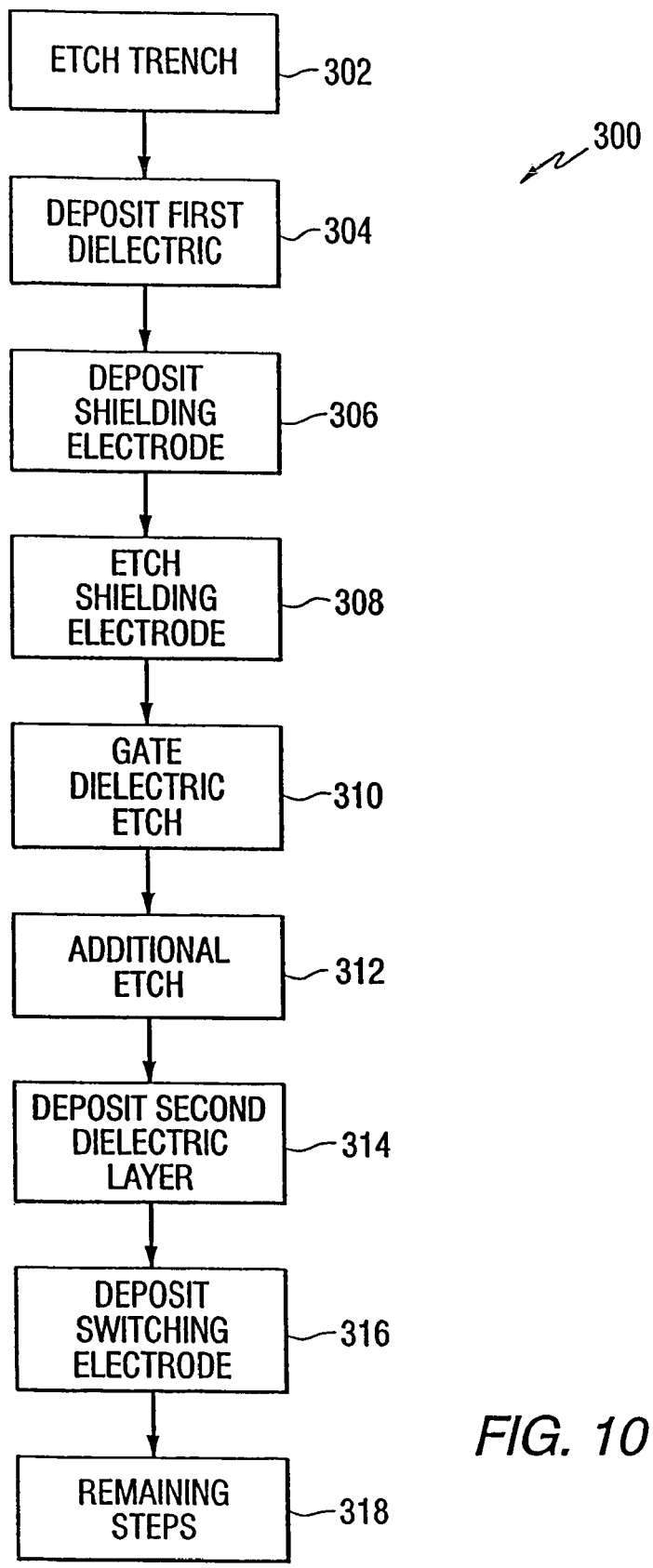
FIG. 10 is a process diagram illustrating one embodiment of a process by which the device of FIG. 2 is fabricated.

Fabrication of MOSFET 100, which is configured as a vertical trench MOSFET, is accomplished by process flow 300 as best shown in FIG. 10. Process flow 300 is substantially a conventional process flow for forming trench-gated MOSFETs up until the process of forming gate 120. More particularly, trench 124 is etched by a conventional trench-forming process 302. Dielectric layer 128 is then deposited on the sidewalls and bottom of trench 124, also by a known and conventional first dielectric layer deposition process 304. Thereafter, the fabrication process 300 for fabricating MOSFET 100 departs from departs from the conventional process flow.

Following deposition of dielectric layer 128 by first dielectric layer deposition step 304, a first layer of conductive material is deposited within the sidewall-oxidized trench 124 as part of depositing shielding electrode step 306. This first layer of conductive material is then etched, such as, for example, by a reactive ion isotropic etch, to the desired thickness by shielding electrode etch step 308. Next, gate dielectric layer 128 is etched in gate dielectric layer etching step 310. Gate dielectric etching step 310, such as, for example, an isotropic etch, also removes a predetermined amount of conductive material 130b adjacent dielectric material 128, thereby forming top hat structure 144 and ledges 146 of shielding electrode 120b. One or more additional etching steps 312 are optionally carried out to remove sharp edges and/or corners in shielding electrode 120b. Gate dielectric layer 138 is then deposited by second dielectric layer deposition step 314. Dielectric layer 138 is deposited over the upper surfaces (not referenced) of top hat 144 and ledges 146 of, and over the sidewalls of trench 124 above, shielding electrode 120b. A second conductive material layer is then deposited within trench 124 as part of depositing switching electrode step 316. The remaining processing steps 318 including conventional processing and finishing steps as are known in the art.

Figure 5:
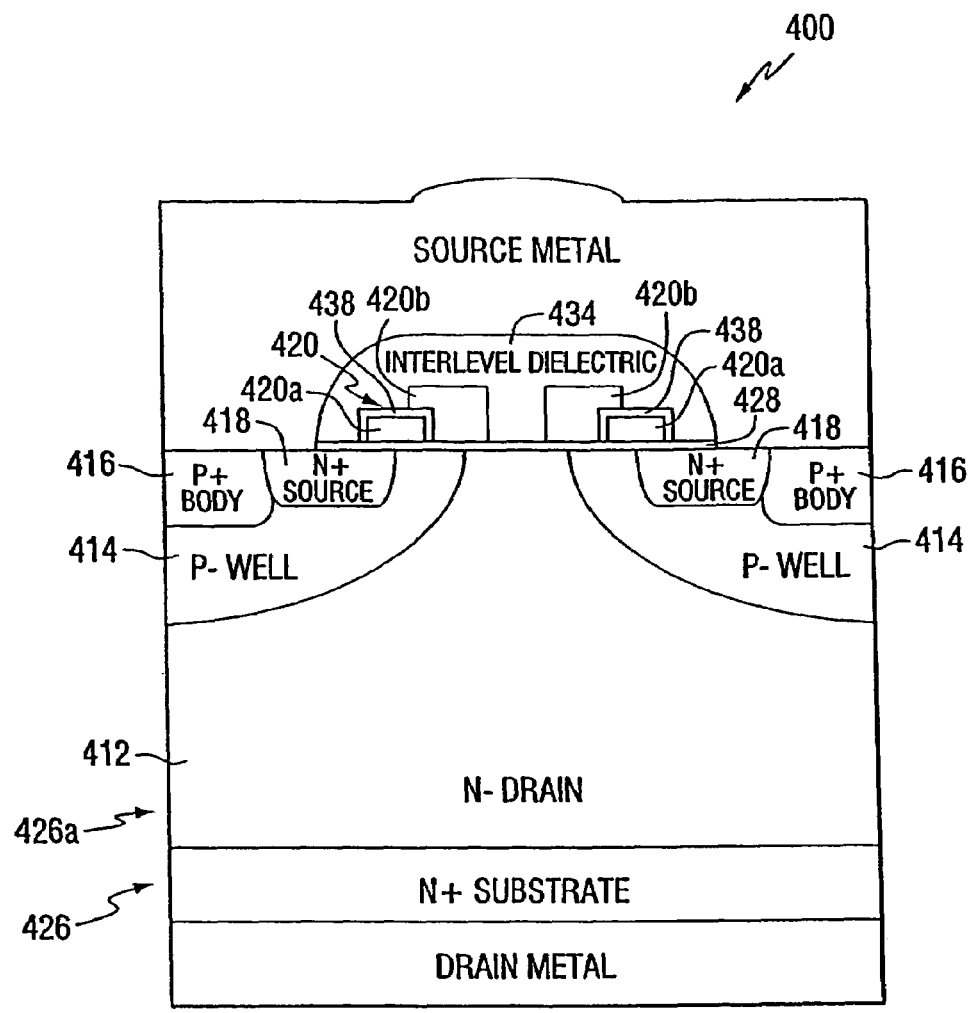
FIG. 5 is a cross-sectional schematic view of one embodiment of a planar MOSFET of the present invention.

Referring now to FIG. 5, a second embodiment of a MOSFET of the present invention is shown. MOSFET 400 is a surface-gate vertical MOSFET that includes a dual overlapping gate structure generally similar to that of MOSFET 100. MOSFET 400 includes many features and structures that are generally similar to MOSFET 100. Like MOSFET 100, MOSFET 400 includes drain 412, well 414, body 416, source 418 and gate structure 420, all of which are formed on substrate 426. In contrast to MOSFET 100, MOSFET 400 is configured as a surface-gated vertical MOSFET. However, similar to gate structure 120, gate structure 420 includes a dual overlapping gated structure that reduces Miller capacitance and switching losses relative to a conventional MOSFET device.

MOSFET 400 is formed on N+ type substrate 426 that includes an upper layer 426a within which is formed N− drain region 412. P-type well regions 414 overlie respective areas of drain region 412. At an upper surface (not referenced) of upper layer 426a and within respective portions of well region 414 are defined heavily doped P+ body regions 416. Source regions 418 are also formed at the upper surface of upper layer 426a and within respective portions of well region 414. Source regions 418 are formed proximate and/or adjacent to body regions 416 such that source regions 418 are disposed between body regions 416. A gate dielectric layer 428, such as, for example, oxide, is deposited over the upper surface of upper layer 416a. Gate dielectric layer 428 partially covers well regions 414 and source regions 418.

Gate structure 420 of MOSFET 400 is, like gate structure 120 of MOSFET 100, divided into separate switching and shielding electrodes that overlap each other. Gate structure 420 includes a pair of switching electrodes 420a and a pair of shielding electrodes 420b which are, as is more particularly described hereinafter, disposed upon and/or over dielectric layers 428, 434 and 438.

Switching electrodes 420a are formed of a layer of conductive material, such as, for example, doped polysilicon, that is deposited over gate dielectric layer 428 and which is etched to form two separate switching electrodes 420a. Respective portions of each switching electrode 420a are disposed over and/or are vertically coplanar with corresponding source 418 and well 414 regions. Switching electrodes 420a and gate dielectric layer 428 are then covered with a second dielectric layer 438, such as, for example, oxide. The portion of second dielectric layer 438 that overlies gate dielectric layer 428 in the area between switching electrodes 420a is then removed by an etching process that leaves intact the portion of second dielectric layer 438 that covers the switching electrodes 420a themselves.

Shielding electrodes 420b are then formed by the deposition of a second layer of conductive material, such as, for example, doped polysilicon, over first and second dielectric layers 428 and 438. This second layer of conductive material is etched to form shielding electrodes 420b. Respective portions of each shielding electrode 420b are disposed over and/or are vertically coplanar with a corresponding well region 414 and an adjacent portion of drain region 412, to thereby form overlapping dual-gated structure 420. More particularly, the etching of shielding electrodes 420b leaves a predetermined portion of the second layer of conductive material above (i.e., overlying) switching electrode 420a intact. Thus a portion of each shielding electrode 420b is disposed above and overlaps a corresponding switching electrode 420a to thereby form the dual overlapping surface-gated structure 420, which reduces Miller capacitance and improves switching times relative to a conventional MOSFET device. Interlevel dielectric layer 434 is then deposited over gate structure 420 and dielectric layers 428 and 438.

Figure 6:
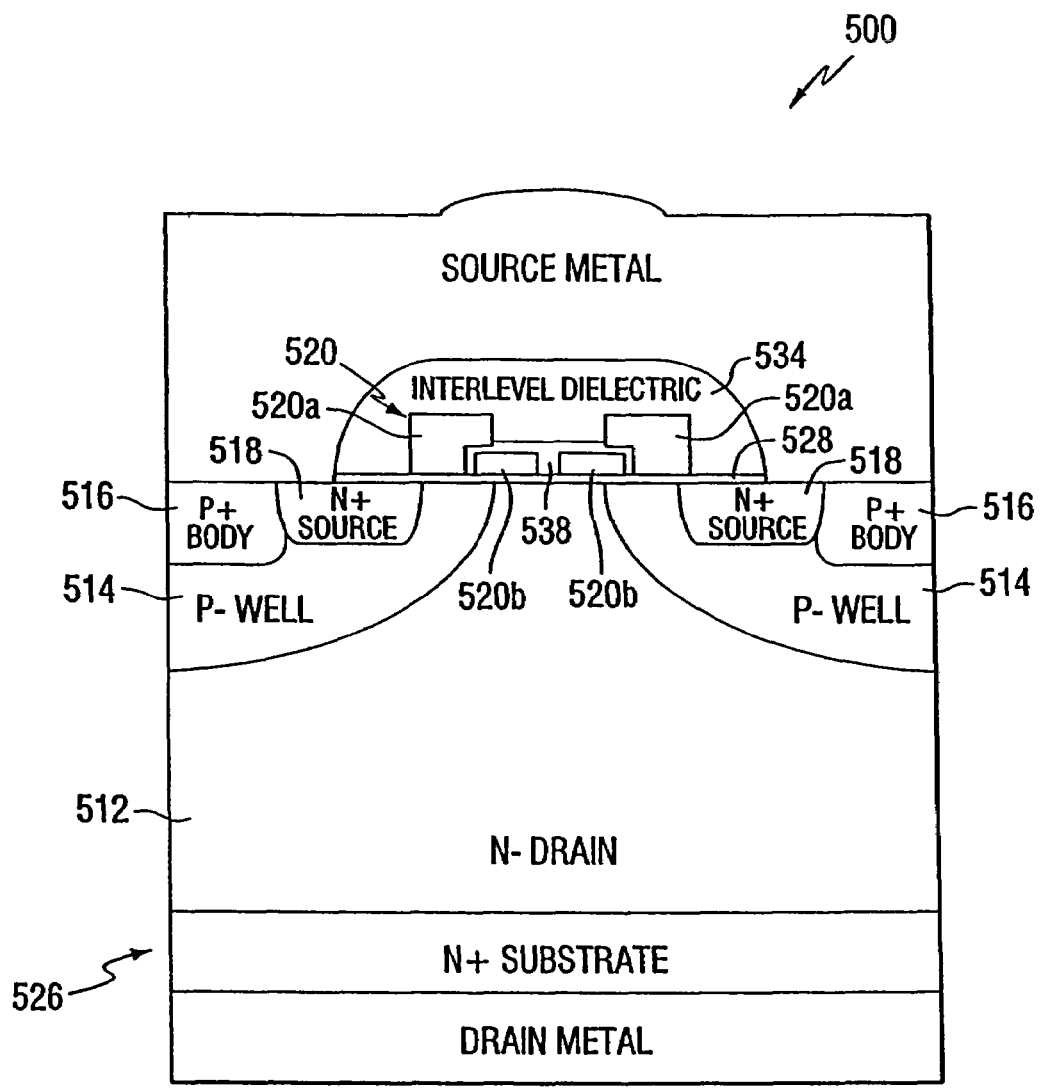
FIG. 6 is a cross-sectional schematic view of a second embodiment of a planar MOSFET of the present invention.

Referring now to FIG. 6, another embodiment of a MOSFET of the present invention is shown. MOSFET 500 is also configured as a surface-gated vertical MOSFET that includes a dual overlapping surface-gated structure 520 similar to gate structure 420 of MOSFET 400. However, whereas in gate structure 420 a portion of each shielding electrode 420b overlaps a corresponding switching electrode 420a, each of the switching electrodes 520a of gate structure 520 include respective portions (not referenced) that overlap (i.e., overlie or are disposed above) a corresponding shielding electrode 420a. The remaining structure of MOSFET 500 is substantially similar to MOSFET 400, and is therefore not discussed in detail.

Figure 7:
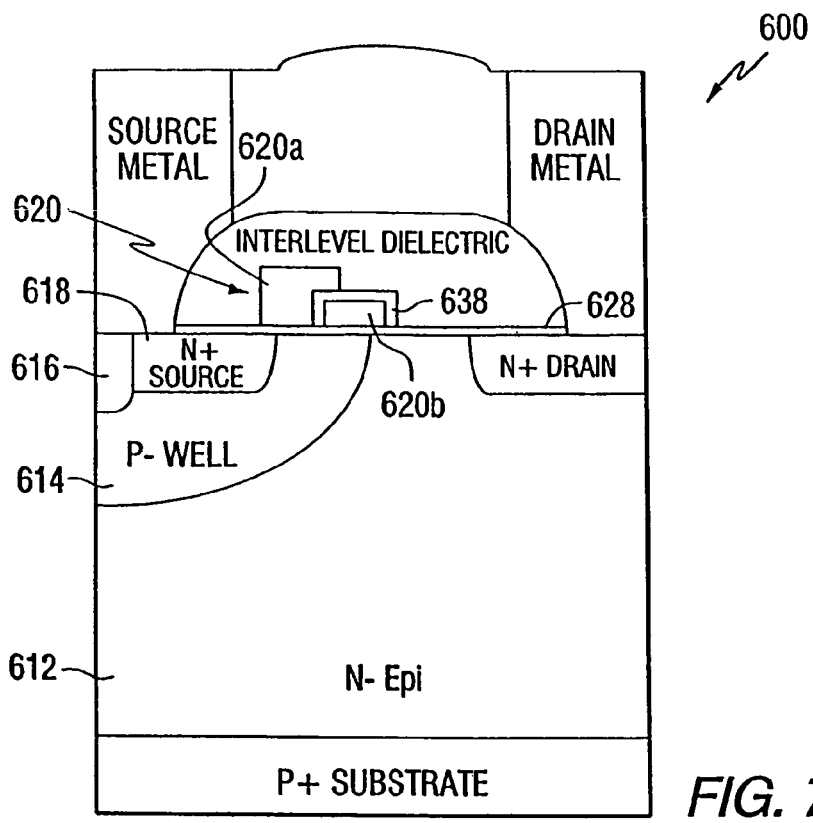
FIG. 7 is a cross-sectional schematic view of one embodiment of a lateral MOSFET of the present invention.

Referring now to FIG. 7, a further embodiment of a MOSFET of the present invention is shown. MOSFET 600 is configured as a lateral MOSFET that is generally convention in construction, with the exception of overlapping gate structure 620. Gate structure 620 of MOSFET 600 is divided into switching electrode 620a and shielding electrode 620b which overlap each other and are, as is more particularly described hereinafter, disposed upon and/or over dielectric layers 628, 634 and 638.

A layer of conductive material, such as, for example, doped polysilicon, is deposited over gate dielectric layer 628 and is then etched to form shielding electrode 620b, respective portions of which are disposed at least partially over and/or vertically coplanar with well region 614 and drain region 612. Shielding electrode 620a and gate dielectric layer 628 are then covered with a second dielectric layer 638, such as, for example, oxide. An etching process is performed, which leaves the top and sides of shielding electrode 620b covered by second dielectric layer 638, and yet removes second dielectric layer 638 from gate dielectric layer 628.

Switching electrode 620a is then formed by the deposition of a second layer of conductive material, such as, for example, doped polysilicon, over first and second dielectric layers 628 and 638. This second layer of conductive material is then etched to form switching electrode 620a, respective portions of which are disposed over and/or vertically coplanar with well region 614 and source region 618, thereby forming overlapping dual-gated structure 620. More particularly, a portion of switching electrode 620a is disposed upon second dielectric layer 638 and overlies shielding electrode 620b to thereby form the overlapping gate structure 620, which reduces Miller capacitance and improves switching times relative to a conventional MOSFET device.

Figure 8:
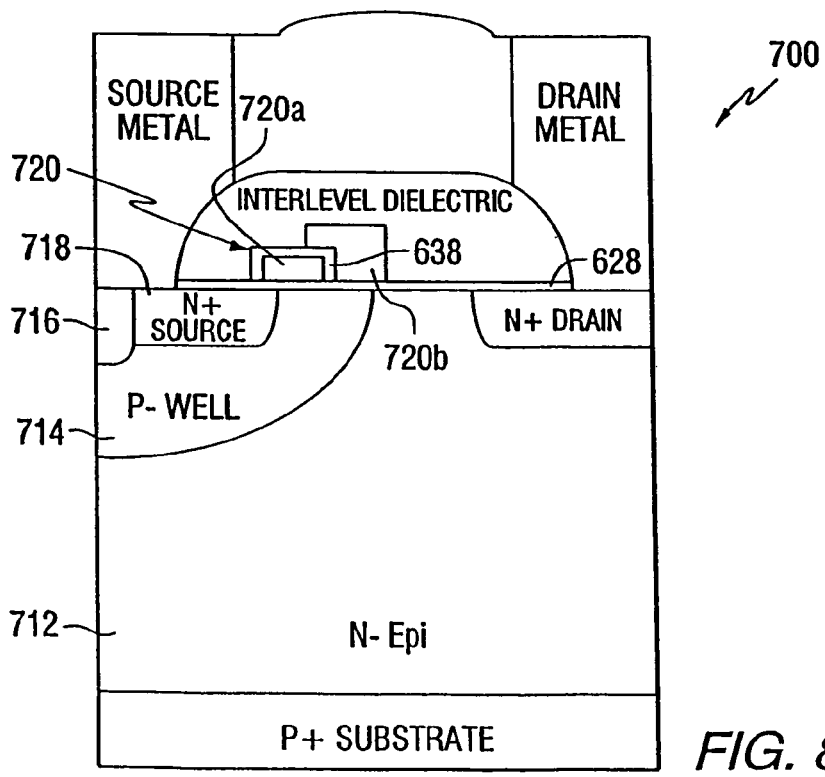
FIG. 8 is a cross-sectional schematic view of a second embodiment of a lateral MOSFET of the present invention.

Referring now to FIG. 8, a still further embodiment of a MOSFET of the present invention is shown. MOSFET 700 is configured as a lateral MOSFET that is generally similar to MOSFET 600. However, whereas in MOSFET 600 a portion of switching electrode 620a overlies and overlaps shielding electrode 620b, MOSFET 700 includes a shielding electrode 720b having a portion that overlies and/or overlaps switching electrode 720a. The remaining structure of MOSFET 700 is substantially similar to MOSFET 600, and is therefore not discussed in detail.

Figure 9:
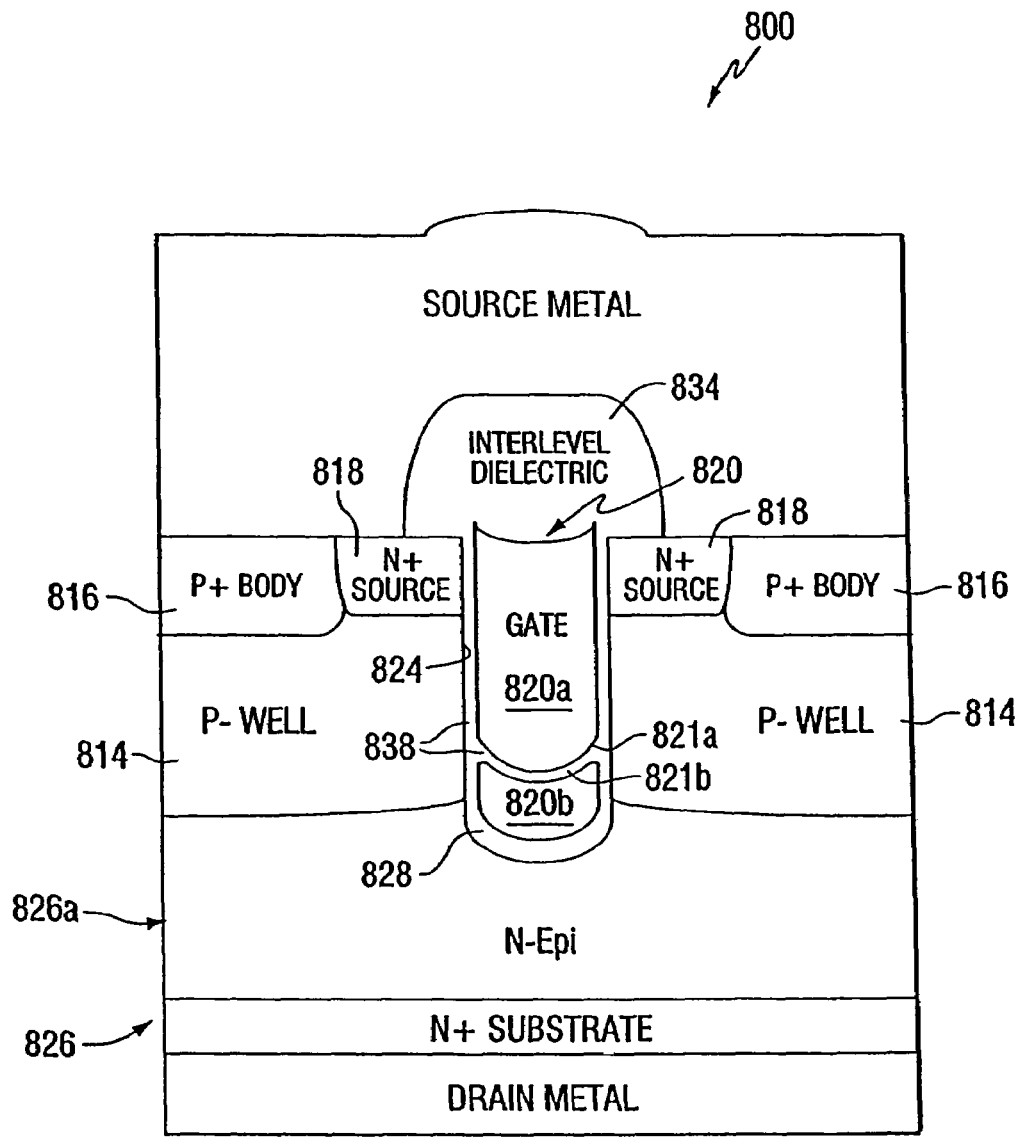
FIG. 9 is a cross-sectional schematic view of one embodiment of a trench MOS-gated structure of the present invention.

Referring now to FIG. 9, yet a further embodiment of a MOSFET of the present invention is shown. MOSFET 800 is configured as a trench-gated MOSFET, and is generally similar to MOSFET 100 with the exception of the structural details of overlapping gate structure 820. Generally, rather than overlapping the gate structure by forming the recesses and top hat structures as described above in regard to overlapping gate structure 120, MOSFET 800 implements the overlapping gate structure 820 by forming the opposing or facing surfaces of the switching and shielding electrodes with a generally complimentary concavity and convexity, respectively.

More particularly, MOSFET 800 includes an overlapping gate structure 820 having a switching electrode 820a and a shielding electrode 820b formed within trench 824. Switching electrode 820a has a convex lower surface 821a, whereas shielding electrode 820b has a concave upper surface 821b. A layer of dielectric material 838 is deposited over, and thus has an upper surface having generally the same concavity as, concave upper surface 821b. Switching electrode 820a is deposited over the concave layer of dielectric material 838, and thus convex lower surface 821a of switching electrode 820a is formed having a shape or convexity that is generally complimentary to concave upper surface 821b. The concavity of concave upper surface 821b is such to ensure that switching and shielding electrodes 820a and 820b, respectively, overlap each other relative to the direction or depth of trench 824. Thus, an overlapping trench-gated structure 820 is formed that reduces the Miller capacitance and improves switching speed in MOSFET 800.

It should be particularly noted that, in the embodiment shown in FIG. 9 and described above, switching electrode 820a has a convex lower surface 821 a and shielding electrode 820b has a concave upper surface 821b, with the concavity of concave upper surface 821b and the convexity of convex lower surface 821 are such that switching and shielding electrodes 820a and 820b, respectively, overlap each other relative to the direction or depth of trench 824. However, it is to be understood that MOSFET 800 can be alternately configured, such as, for example, with a switching electrode 820a having a concave lower surface 821a and shielding electrode 820b having a convex upper surface 821b, with the convexity of convex upper surface 821b and the concavity of concave lower surface 821 being such that switching and shielding electrodes 820a and 820b, respectively, overlap each other relative to the direction or depth of trench 824 to thereby form the overlapping trench-gated structure.

In the embodiment shown in FIG. 2, sidewalls 142 of switching electrode 120a and top hat portion 144 of shielding electrode 120b at least partially overlap each other in an axial or depth direction relative to trench 124 and thereby provide the overlapping gate electrode structure. However, it is to be understood that the gate of MOSFET 100 can be alternately configured, such as, for example, with the switching electrode configured with a top hat or projecting portion and the shielding electrode configured with a recess to thereby provide for a similar overlapping gate electrode structure that is, in essence, an upside down version of gate 120 of MOSFET 100.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A method of fabricating a semiconductor device on a semiconductor substrate of a first polarity, said method comprising:
    forming a drain region within an epitaxial layer of the semiconductor substrate, the drain region being lightly-doped with a dopant of the first polarity;
    forming a well region in the drain region, said well region being lightly-doped with a dopant of a second polarity;
    forming a source region within the well region, the source region being heavily doped with a dopant of the first polarity;
    forming a first dielectric layer covering predetermined exposed portions of the source, drain and well regions;
    forming a switching electrode over a portion of the first dielectric layer, respective portions of the switching electrode being coplanar with the source and well regions;
    forming at least one shielding electrode over a portion of the first dielectric layer, respective portions of the shielding electrode being coplanar with the drain region, well region, and the switching electrode; and
    forming a second dielectric layer between the switching and shielding electrodes.

2. The method of claim 1, comprising the further processes of:
    forming a trench extending from an upper surface of said well region into and terminating within said drain region;
    wherein said process of forming a first dielectric layer comprises covering sidewalls and bottoms of the trench with a layer of dielectric material; and
    wherein said processes of forming the switching and shielding electrodes comprise filling respective portions of the trench with switching and shielding electrode material.

3. The method of claim 2, wherein:
    said process of forming the shielding electrode comprises filling a first predetermined portion of the trench with the shielding electrode material;
    said process of forming the switching electrode comprises filling a second predetermined portion of the trench with the switching electrode material; and
    wherein said first and second portions overlap.

4. The method of claim 3, wherein said first predetermined portion of the trench comprises a lower portion thereof, and said second predetermined portion of the trench comprises an upper portion thereof.

5. The method of claim 4, comprising the further process of forming a top hat portion on the shielding electrode.

6. The method of claim 5, wherein said process of forming a top hat portion comprises etching the shielding electrode.

7. The method of claim 6, wherein said process of forming the switching electrode includes surrounding the top hat portion of the shielding electrode with switching electrode material.

8. The method of claim 1, wherein said process of forming a first dielectric layer comprises covering predetermined portions of an upper surface of the drain, source and well regions with a layer of dielectric material, and wherein said processes of forming the switching and shielding electrodes comprises forming respective layers of switching and shielding electrode material, portions of each of the layers of electrode material being at least partially disposed over the first dielectric layer.

9. The method of claim 8, comprising the further step of forming a second dielectric layer over the switching electrode, a portion of the shielding electrode being formed over the second dielectric layer and over the switching electrode.

10. A method for forming an improved gate structure for an integrated circuit, the integrated circuit formed on a substrate of a first polarity, a lightly-doped drain region of the first polarity within an epitaxial layer of the semiconductor substrate, a lightly-doped well region of a second polarity in the drain region, a heavily-doped source region of the first polarity within the well region, said method comprising:
    forming a first dielectric layer covering predetermined exposed portions of the source, drain and well regions;
    forming a switching electrode over a portion of the first dielectric layer, respective portions of the switching electrode being coplanar with the source and well regions;
    forming at least one shielding electrode over a portion of the first dielectric layer, respective portions of the shielding electrode being coplanar with the drain region, well region, and the switching electrode; and
    forming a second dielectric layer between the switching and shielding electrodes.

11. The method of claim 10, comprising the further processes of:
    forming a trench extending from an upper surface of said well region into and terminating within said drain region;
    wherein said process of forming a first dielectric layer comprises covering sidewalls and bottoms of the trench with a layer of dielectric material; and
    wherein said processes of forming the switching and shielding electrodes comprise filling respective portions of the trench with switching and shielding electrode material.

12. The method of claim 10, wherein:
    said process of forming the shielding electrode comprises filling a first predetermined portion of the trench with the shielding electrode material;
    said process of forming the switching electrode comprises filling a second predetermined portion of the trench with the switching electrode material; and
    wherein said first and second portions overlap.

13. The method of claim 12, wherein said first predetermined portion of the trench comprises a lower portion thereof, and said second predetermined portion of the trench comprises an upper portion thereof.

14. The method of claim 13, comprising the further process of forming a top hat portion on the shielding electrode.

15. The method of claim 14, wherein said process of forming the switching electrode includes surrounding the top hat portion of the shielding electrode with switching electrode material.

16. The method of claim 14, wherein said process of forming a top hat portion comprises etching the shielding electrode.

17. A method for reducing miller capacitance and switching losses in an integrated circuit, the integrated circuit formed on a substrate of a first polarity, a lightly-doped drain region of the first polarity within an epitaxial layer of the semiconductor substrate, a lightly-doped well region of a second polarity in the drain region, a heavily-doped source region of the first polarity within the well region, said method comprising:

provending a switching gate electrode having respective portions coplanar with the source and well regions, said switching gate electrode configured for switching the integrated circuit on and off in response to a relatively small change in applied voltage; and forming a shielding gate electrode having respective portions coplanar with the switching electrode, the drain region and the well region, said shielding electrode configured for charging a gate-to-drain overlap region of the integrated circuit.

18. The method of claim 17, wherein the switching and shielding gate electrodes are formed at least partially within a trench.

19. The method of claim 17, wherein said switching and shielding gate electrodes are formed on a surface of the integrated circuit substrate.

20. A process for fabricating a gate for a semiconductor device, the semiconductor device formed on a semiconductor substrate a first polarity, a lightly-doped drain region of the first polarity within an epitaxial layer of the semiconductor substrate, a lightly-doped well region of a second polarity in the drain region, a heavily-doped source region of the first polarity within the well region, said method comprising:

etching a trench in the epitaxial layer, said trench exposing portions of the well, source and drain regions, said trench terminating in the drain region;

lining sidewalls and a bottom of the trench with a first dielectric layer;

depositing a first conductive layer of material in the trench;

etching the first conductive layer of material to thereby form a shielding electrode, the shielding electrode being coplanar with the drain and well regions;

etching the first dielectric layer;

depositing a second dielectric layer over the shielding electrode and the sidewalls of the trench; and depositing a second conductive layer of material in the trench to thereby form a switching electrode, respective portions thereof being coplanar with the shielding electrode, well region and source region.

21. The method of claim 20, wherein said process of etching the first conductive layer comprises forming one of a depression and projection in an upper surface of the first conductive layer.

22. The method of claim 21, wherein said process of etching the first conductive layer comprises forming a top hat portion therein.

* * * * *